United States Patent
Kawamoto

(10) Patent No.: US 8,536,869 B2
(45) Date of Patent: Sep. 17, 2013

(54) MAGNETIC RESONANCE IMAGING APPARATUS

(75) Inventor: Hiromi Kawamoto, Yaita (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 540 days.

(21) Appl. No.: 12/766,006

(22) Filed: Apr. 23, 2010

(65) Prior Publication Data

US 2010/0271028 A1    Oct. 28, 2010

(30) Foreign Application Priority Data

Apr. 23, 2009  (JP) ................................. 2009-105366
Apr. 22, 2010  (JP) ................................. 2010-098651

(51) Int. Cl.
*G01V 3/00* (2006.01)
(52) U.S. Cl.
USPC ........................................ 324/318; 324/319
(58) Field of Classification Search
USPC ................... 324/318, 319, 320, 322
See application file for complete search history.

(56) References Cited

U.S. PATENT DOCUMENTS

| 6,525,537 | B2 | 2/2003 | Nerreter |
| 7,295,012 | B1* | 11/2007 | Lvovsky ........................ 324/320 |
| 7,495,442 | B2* | 2/2009 | Heid ............................. 324/318 |
| 7,741,847 | B2* | 6/2010 | Nakabayashi et al. ........ 324/320 |

FOREIGN PATENT DOCUMENTS

JP    2006-311957    11/2006

OTHER PUBLICATIONS

U.S. Appl. No. 12/521,831, Yoshitomo Sakakura, filed Jun. 30, 2009.

\* cited by examiner

*Primary Examiner* — Louis Arana
(74) *Attorney, Agent, or Firm* — Nixon & Vanderhye PC

(57) ABSTRACT

A magnetic resonance imaging apparatus includes; a gradient coil that applies a gradient magnetic field to a static magnetic field in which an examined subject is placed; a metal shim with which the gradient coil is provided and that corrects spatial nonuniformity of the static magnetic field; an executing unit that executes an imaging sequence; and a controlling unit that, before execution of the imaging sequence is started, raises the temperature of the metal shim up to a saturation temperature that is to be reached during the execution of the imaging sequence.

20 Claims, 14 Drawing Sheets

→ FLOW OF COOLING WATER
---→ FLOW OF SIGNAL

MAGNETIC RESONANCE IMAGING APPARATUS

CROSS-REFERENCE TO RELATED APPLICATIONS

This application is based upon and claims the benefit of priority from the prior Japanese Patent Application No. 2009-105366, filed on Apr. 23, 2009; and Japanese Patent Application No. 2010-098651, filed on Apr. 22, 2010, the entire contents of both of which are incorporated herein by reference.

BACKGROUND

1. Technical Field

The present document relates to a magnetic resonance imaging apparatus.

2. Related Art

Magnetic resonance imaging apparatuses are apparatuses that are configured so as to obtain an image of the inside of an examined subject (hereinafter, "subject") by using a magnetic resonance phenomenon. A magnetic resonance imaging apparatus includes various types of units as follows, for example, that are necessary in an image taking process: a static magnetic field magnet that generates a static magnetic field in an image taking area; a gradient coil that applies the gradient magnetic field to a subject placed in the static magnetic field; and a high frequency coil that receives a magnetic resonance signal from the subject to which the gradient magnetic field has been applied. Among these various types of units, there are some units that generate heat during scanning processes.

For example, the gradient coil significantly generates heat during scanning processes because a pulsed electric current is repeatedly supplied thereto according to a pulse sequence. The gradient coil is provided with iron shims used for correcting nonuniformity of the static magnetic field within the image taking area. When the temperature of the gradient coil changes, magnetic susceptibility of the iron shims gets affected and also changes.

When the magnetic susceptibility of the iron shims changes, a change occurs in uniformity of the static magnetic field within the image taking area, and in particular, the center frequency significantly changes. Such changes in the center frequency can be a cause of hindrance for fat suppressions or a cause of artifacts in the images. Accordingly, to obtain images having a stable image quality, it is important to inhibit the changes in the temperature of the gradient coil. In particular, because more powerful gradient magnetic fields are being used in recent years, how to control the heat generated by the gradient coil is becoming an even more important issue.

Generally speaking, to address this issue, Magnetic Resonance Imaging (MRI) apparatuses are each provided with a cooling device for cooling the heat generating sources such as the gradient coil. The cooling device includes, for example, a heat exchanger and a circulating pump and is configured so as to cool the heat generating sources by causing a cooling medium (e.g., water) to circulate through a cooling pipe provided in the surroundings of the heat generating sources (see, for example, Japanese Patent Application Laid-open No. 2006-311957).

The conventional technique described above, however, has a problem where, as explained below, it is not possible to inhibit the changes in the temperature of the heat generating sources according to the magnitude of the heat generated during the scanning processes.

For example, according to the conventional technique described above, in the case where the heat generated by a heat generating source has increased during a scanning process, it is necessary to increase the flow rate of the cooling medium for the purpose of lowering the temperature of the heat generating source. However, as for the gradient coil, for example, because the diameter size of the cooling pipe is limited by structural limitations, it is not possible to increase the flow rate of the cooling medium beyond a predetermined amount. As a result, it is not possible to inhibit the rise in the temperature of the gradient coil beyond the limit of the maximum flow rate.

Alternatively, for example, in the case where the cooling medium is configured so as to have a lower temperature, although it is possible to keep the temperature of the gradient coil low before the scanning process is started, the temperature of the gradient coil rises after the scanning process is started if the temperature of the cooling medium remains the same. As a result, even if the cooling medium is configured so as to have the lower temperature, it is not possible to inhibit the changes in the temperature of the gradient coil during the scanning process.

BRIEF SUMMARY OF THE INVENTION

According to one aspect of the present exemplary embodiments, a magnetic resonance imaging apparatus includes a gradient coil that applies a gradient magnetic field to a static magnetic field in which an examined subject is placed; a metal shim is provided with the gradient coil that corrects spatial nonuniformity of the static magnetic field; an executing unit that executes an imaging sequence; and a controlling unit that, before execution of the imaging sequence is started, raises a temperature of the metal shim up to a predetermined temperature that is to be reached during execution of the imaging sequence.

DETAILED DESCRIPTION OF THE PREFERRED EMBODIMENTS

In the following sections, exemplary embodiments of a magnetic resonance imaging apparatus (hereinafter, an "MRI apparatus") will be explained in detail, with reference to the accompanying drawings. In the exemplary embodiments described below, examples will be explained in which a gradient coil serves as an example of a heat generating source to be cooled, while water (hereinafter, "cooling water") is used as a cooling medium for the cooling purpose; however, the present invention is not limited to the exemplary embodiments.

Figure 1:
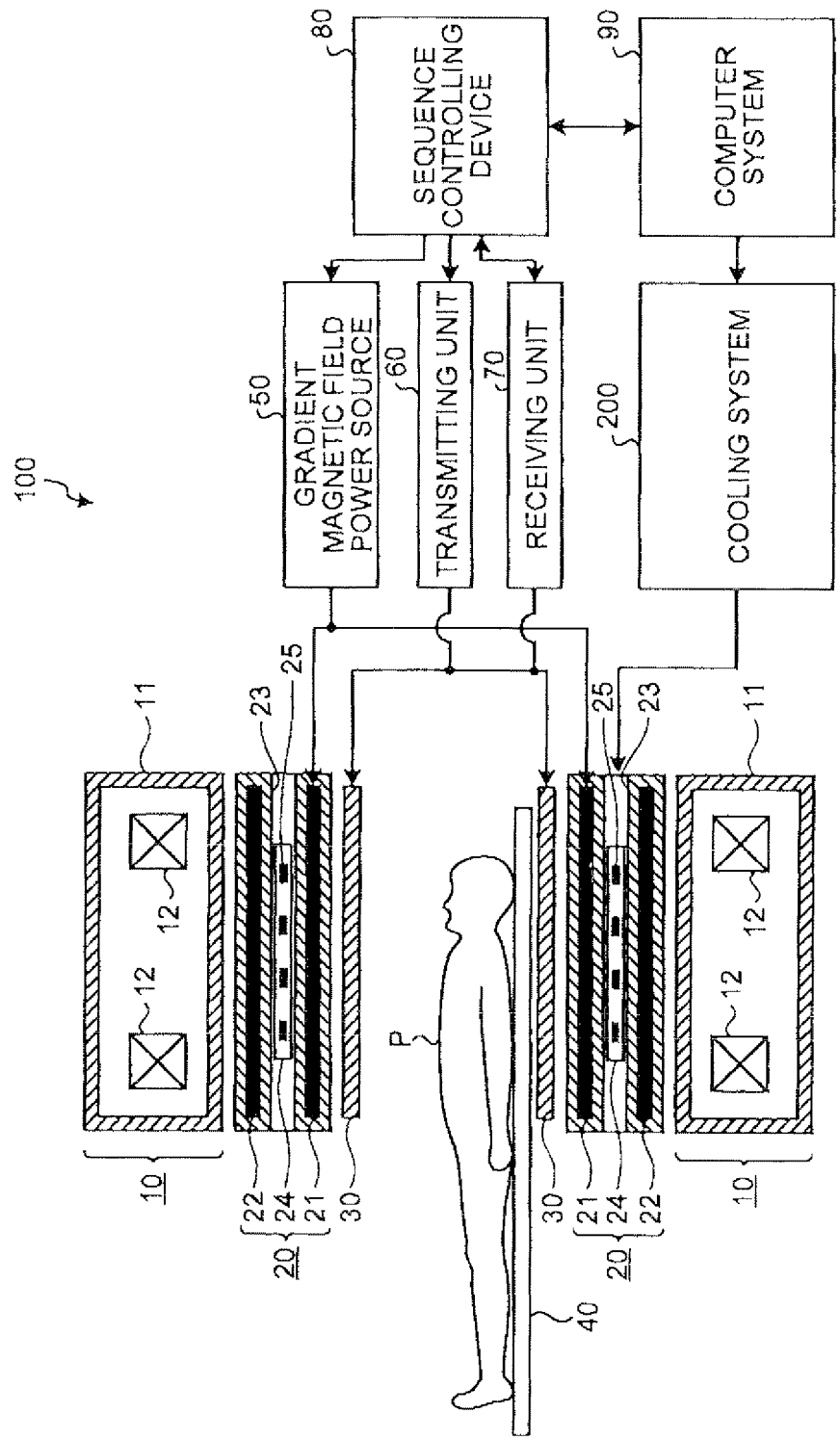
FIG. 1 is a diagram of an MRI apparatus according to a first embodiment of the present invention.

First, a configuration of an MRI apparatus 100 according to a first embodiment of the present invention will be explained. FIG. 1 is a diagram of the MRI apparatus 100 according to the first embodiment. As shown in FIG. 1, the MRI apparatus 100 includes a static magnetic field magnet 10, a gradient coil 20, a radio frequency (RF) coil 30, a top plate 40, a gradient magnetic field power source 50, a transmitting unit 60, a receiving unit 70, a sequence controlling device 80, a computer system 90, and a cooling system 200.

The static magnetic field magnet 10 includes: a vacuum container 11 that is substantially in the shape of a circular cylinder; and superconducting coils 12 that are impregnated with a cooling liquid in the vacuum container 11. The static magnetic field magnet 10 is configured so as to generate a static magnetic field in a bore (i.e., the space on the inside of the circular cylindrical structure of the static magnetic field magnet 10), which is an image taking area.

The gradient coil 20 is substantially in the shape of a circular cylinder and is fixed to the inside of the static magnetic field magnet 10. The gradient coil 20 includes: a main coil 21 that applies a gradient magnetic field in the directions of X-, Y-, and Z-axes by using an electric current supplied by the gradient magnetic field power source 50; and a shield coil 22 that cancels a leakage magnetic field of the main coil 21.

In this situation, shim tray insertion guides 23 are formed between the main coil 21 and the shield coil 22. A shim tray 24 storing therein iron shims 25 used for correcting nonuniformity of magnetic fields within the bore is inserted into each of the shim tray insertion guides 23. The structure of the gradient coil 20 will be explained in detail later.

The RF coil 30 is fixed to the inside of the gradient coil 20 in such a manner that portions thereof oppose each other while a subject is interposed therebetween. The RF coil 30 radiates an RF pulse transmitted from the transmitting unit 60 onto the subject P and receives a magnetic resonance signal released from the subject P due to excitation of atomic nuclei of hydrogen.

The top plate 40 is provided on a bed (not shown) in such a manner that the top plate 40 is movable in a horizontal direction. When an image is to be taken, the subject P is placed on the top plate 40 and moved to the inside of the bore. The gradient magnetic field power source 50 supplies the electric current to the gradient coil 20 based on an instruction from the sequence controlling device 80.

The transmitting unit 60 transmits the RF pulse to the RF coil 30, based on an instruction from the sequence controlling device 80. The receiving unit 70 detects the magnetic resonance signal that has been received by the RF coil 30 and transmits raw data obtained by digitalizing the detected magnetic resonance signal to the sequence controlling device 80.

Under the control of the computer system 90, the sequence controlling device 80 performs a scanning process on the subject P by driving the gradient magnetic field power source 50, the transmitting unit 60, and the receiving unit 70. After that, when the raw data is transmitted from the receiving unit 70 as a result of the scanning process, the sequence controlling device 80 transmits the raw data to the computer system 90.

The computer system 90 controls the entirety of the MRI apparatus 100. More specifically, the computer system 90 includes: an input unit that receives various types of inputs from an operator; a sequence controlling unit that causes the sequence controlling device 80 to perform the scanning process, based on image taking conditions that have been input by the operator; an image reconstructing unit that reconstructs an image based on the raw data that has been transmitted from the sequence controlling device 80; a storage unit that stores therein the reconstructed image and the like; a display unit that displays various types of information such as the reconstructed image; and a main controlling unit that controls operations of functional units, based on instructions from the operator.

When the computer system 90 has received an instruction from the operator indicating that the scanning process should be started, the computer system 90 controls the constituent elements explained above as necessary, and also transmits a scanning start notification to the cooling system 200.

The cooling system 200 cools various types of units included in the MRI apparatus 100 by causing cooling water to circulate among these units. The details of the cooling system 200 will be explained in detail later.

Figure 2:
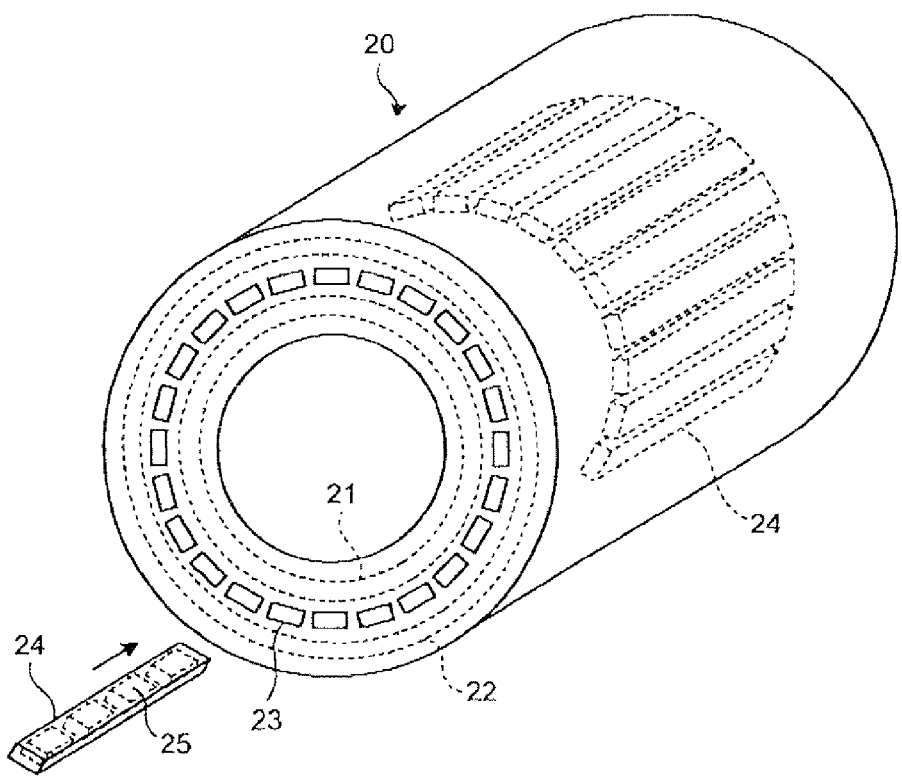
FIG. 2 is a perspective view depicting a structure of a gradient coil shown in FIG. 1.

Next, a structure of the gradient coil 20 shown in FIG. 1 will be explained. FIG. 2 is a perspective view depicting a structure of the gradient coil 20 shown in FIG. 1. As shown in FIG. 2, the gradient coil 20 includes the main coil 21 and the shield coil 22, which are each substantially in the shape of a circular cylinder. The shim tray insertion guides 23 are formed between the main coil 21 and the shield coil 22.

Each of the shim tray insertion guides 23 is a through hole having openings on the two end faces of the gradient coil 20. Each of the shim tray insertion guides 23 is formed so as to extend in the lengthwise direction of the gradient coil 20 and to extend along the entire length of the gradient coil 20. The shim tray insertion guides 23 are formed in the space between the main coil 21 and the shield coil 22 so as to be positioned parallel to one another, with regular intervals therebetween in the circumferential direction. Each of the shim tray insertion guides 23 has a different one of the shim trays 24 inserted therein.

Each of the shim trays 24 is made of a resin that is a nonmagnetic and electrically-nonconductive material and is substantially in the shape of a stick. Each of the shim trays 24 stores therein a predetermined number of iron shims 25. Each of the shim trays 24 is inserted into a different one of the shim tray insertion guides 23 and is fixed in a middle portion of the gradient coil 20.

Figure 3:
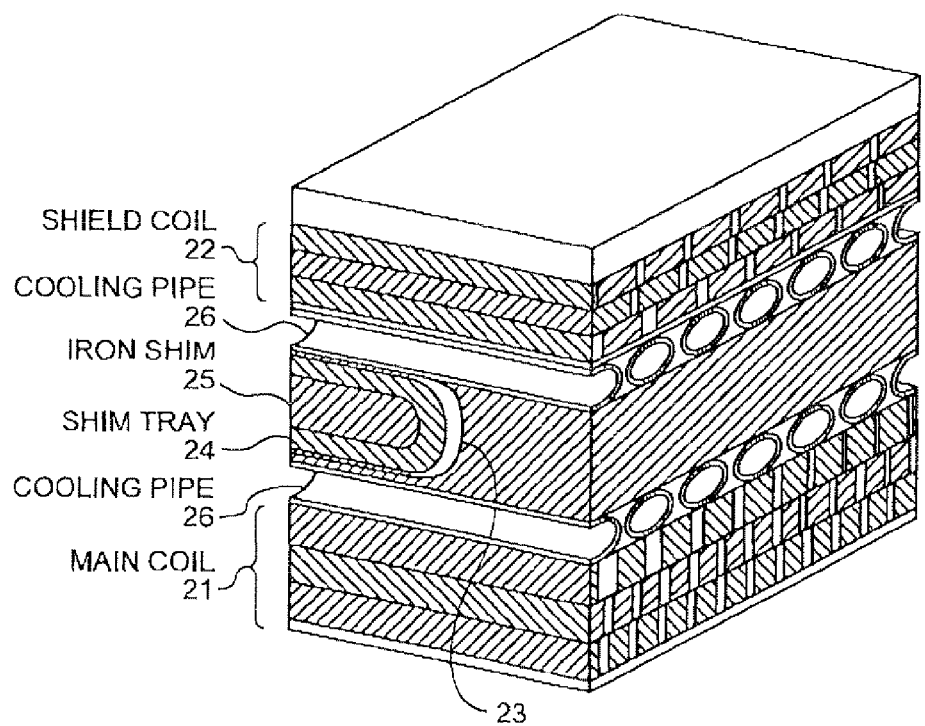
FIG. 3 is a drawing of an internal structure of the gradient coil shown in FIG. 2.

Although not shown in FIG. 2, a cooling pipe is embedded in the gradient coil 20 in a spiral manner so as to fit the circular cylindrical structure of the gradient coil 20. FIG. 3 is a drawing of an internal structure of the gradient coil 20 shown in FIG. 2. FIG. 3 is a drawing of one portion of the gradient coil 20. The top of the drawing corresponds to the outer side of the circular cylindrical structure, whereas the bottom of the drawing corresponds to the inner side of the circular cylindrical structure.

As shown in FIG. 3, a cooling pipe 26 is embedded in the gradient coil 20 in a spiral manner so as to be positioned on the inside and the outside of the shim tray insertion guides 23, i.e., so as to be positioned between the shim tray insertion guides 23 and the main coil 21 and between the shim tray insertion guides 23 and the shield coil 22. The cooling water sent from the cooling system 200 flows into the cooling pipe 26, circulates inside the gradient coil 20 through the cooling pipe 26, and flows out to the outside of the gradient coil 20. In this manner, the gradient coil 20 is cooled by the cooling water circulating inside the gradient coil 20 through the cooling pipe 26.

Figure 4:
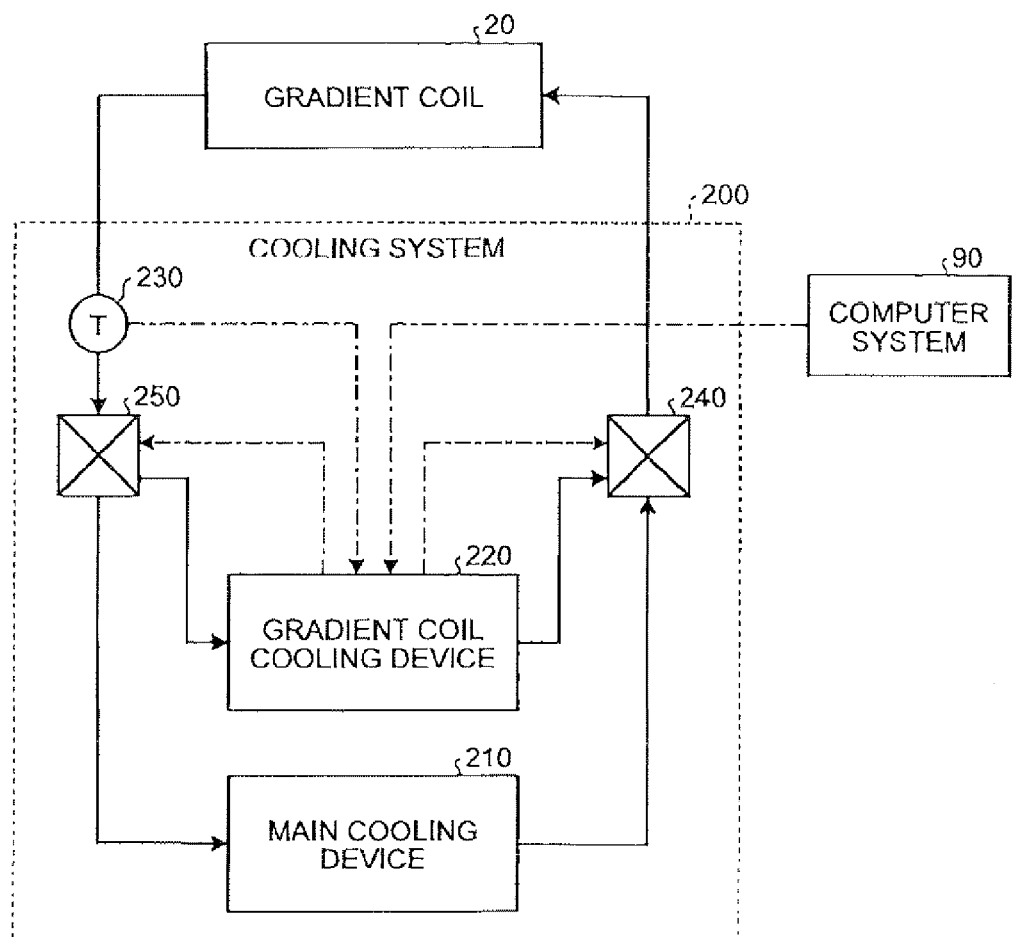
FIG. 4 is a block diagram of a cooling system according to the first embodiment.

Next, a configuration of the cooling system 200 according to the first embodiment will be explained. FIG. 4 is a block diagram of the cooling system 200 according to the first embodiment. As shown in FIG. 4, the cooling system 200 includes a main cooling device 210, a gradient coil cooling device (hereinafter, "gradient coil cooling device") 220, a temperature monitor 230, and valves 240 and 250.

The temperature monitor 230 detects a temperature T of the cooling water flowing out of the gradient coil 20. The gradient coil cooling device 220 is notified of the temperature T that has been detected by the temperature monitor 230.

Under the control of the gradient coil cooling device 220, the valves 240 and 250 control the flows of the cooling water supplied to the gradient coil 20 from the main cooling device 210 and the gradient coil cooling device 220.

The valves 240 and 250 are configured so as to be able to allow only one selected between (a) the cooling water supplied by the main cooling device 210 and (b) the cooling water supplied by the gradient coil cooling device 220 to circulate in the gradient coil 20. Further, the valves 240 and 250 are also configured so as to be able to blend the cooling water supplied from the main cooling device 210 with the cooling water supplied from the gradient coil cooling device 220 and to cause the blended cooling water to circulate in the gradient coil 20. Furthermore, the valves 240 and 250 are also configured so as to be able to adjust the blending ratio of the cooling water, as necessary.

The main cooling device 210 causes the cooling water to circulate through the cooling pipe provided in the gradient coil 20. More specifically, the main cooling device 210 causes the cooling water at a constant temperature to flow into the gradient coil 20 via a circulation path that goes through the valve 240. Also, the main cooling device 210 draws therein the cooling water flowing out of the gradient coil 20 via a circulation path that goes through the valve 250. Although not shown in FIG. 4, the main cooling device 210 is configured so as to cause cooling water to circulate among various types of units other than the gradient coil 20.

The gradient coil cooling device 220 causes the cooling water to circulate in the gradient coil 20 via the cooling water circulation path provided between the main cooling device 210 and the gradient coil 20. The gradient coil cooling device 220 is connected to the computer system 90, to the temperature monitor 230, and to each of the valves 240 and 250 in such a manner that communication therebetween is possible.

More specifically, via the valve 240, the gradient coil cooling device 220 supplies the cooling water having a temperature higher than that of the cooling water supplied by the main cooling device 210, to the circulation path extending from the main cooling device 210 to the gradient coil 20. Also, via the valve 250, the gradient coil cooling device 220 draws therein a part of the cooling water flowing out of the gradient coil 20.

Further, according to the first embodiment, the gradient coil cooling device 220 is configured so as to change the temperature of the cooling water flowing into the gradient coil 20 so that the temperature detected by the temperature monitor 230 is at a constant level, by controlling the condition of the cooling water circulating into the gradient coil 20 from the main cooling device 210. With this arrangement, according to the first embodiment, it is possible to inhibit the changes in the temperature of the gradient coil 20, according to the magnitude of the heat generated during the scanning process. In the following sections, the gradient coil cooling device 220 configured in this manner will be explained in detail.

Figure 5:
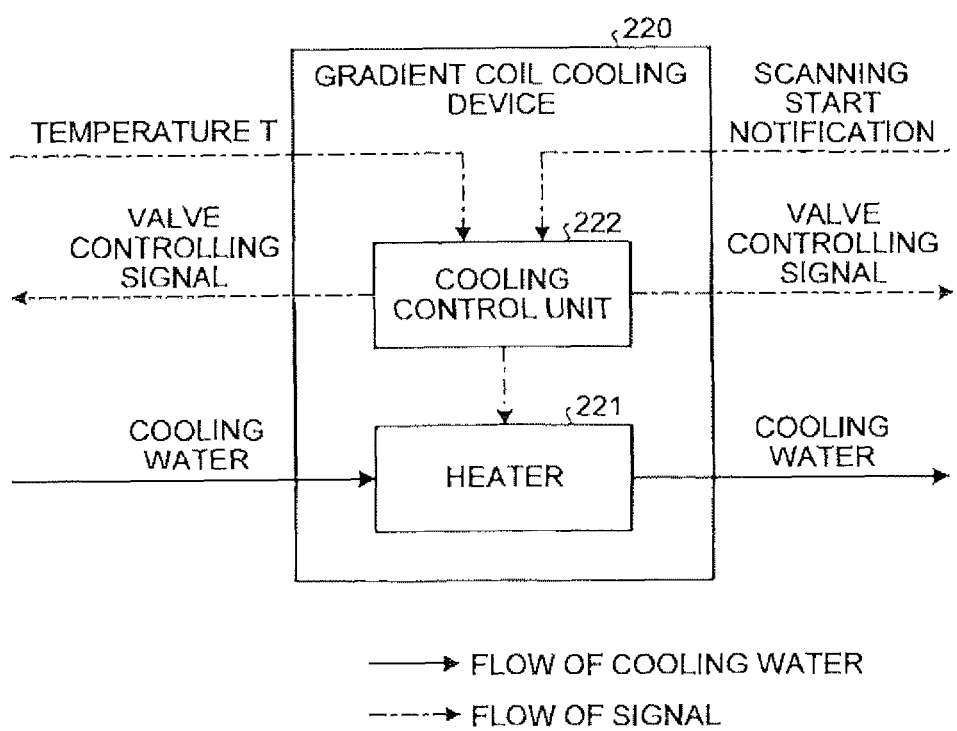
FIG. 5 is a block diagram of a gradient coil cooling device (hereinafter, a "gradient coil cooling device") according to the first embodiment.

First, a configuration of the gradient coil cooling device 220 according to the first embodiment will be explained. FIG. 5 is a block diagram of the gradient coil cooling device 220 according to the first embodiment. As shown in FIG. 5, the gradient coil cooling device 220 includes a heater 221 and a cooling control unit 222.

The heater 221 heats the cooling water supplied by the gradient coil cooling device 220. More specifically, under the control of the cooling control unit 222, the heater 221 adjusts, as necessary, the temperature of the cooling water supplied from the gradient coil cooling device 220, by changing the heating temperature to heat the cooling water.

The cooling control unit 222 changes the temperature of the cooling water flowing into the gradient coil 20, based on the temperature that has been detected by the temperature monitor 230. More specifically, by controlling the condition of the cooling water circulating into the gradient coil 20 from the main cooling device 210, the cooling control unit 222 changes the temperature of the cooling water flowing into the gradient coil 20 so that the temperature detected by the temperature monitor 230 is kept at the constant level. It should be noted that "the temperature kept at the constant level" may include an error within a predetermined tolerance range.

For example, before the scanning process is started, the cooling control unit 222 raises the temperature of the gradient coil 20 up to a predetermined level, by causing the cooling water having a temperature higher than the normal temperature to circulate in the gradient coil 20. In the following sections, the process of raising the temperature of the gradient coil 20 up to the predetermined level before the scanning process is started will be referred to as a "preheating process".

More specifically, the cooling control unit 222 heats the cooling water until the temperature of the cooling water reaches the predetermined level (e.g., 40° C.) that is higher than the normal temperature, by controlling the heater 221. After that, by transmitting a valve controlling signal, the cooling control unit 222 controls the valves 240 and 250 so that the cooling water flowing from the main cooling device 210 to the gradient coil 20 is blocked, and also, so that only the cooling water that has been heated to the predetermined temperature by the heater 221 flows into the gradient coil 20. With this arrangement, it is possible to raise the temperature of the gradient coil 20 up to the predetermined level that is suitable for the scanning process.

After that, when the scanning process has been started, the temperature of the gradient coil 20 rises due to a pulse signal. Thus, after the scanning process has been started, the cooling control unit 222 lowers the temperature of the cooling water flowing into the gradient coil 20 so that the temperature detected by the temperature monitor 230 is kept at a substantially constant level near the temperature (e.g., 40° C.) that has been reached during the preheating process.

More specifically, when having received a scanning start notification from the computer system 90, the cooling control unit 222 controls the valves 240 and 250 so that blended cooling water obtained by blending the cooling water supplied from the main cooling device 210 with the cooling water supplied from the gradient coil cooling device 220 flows into the gradient coil 20, by transmitting a valve controlling signal. In this situation, the cooling control unit 222 changes the blending ratio of the cooling water supplied from the cooling devices so that the temperature of the cooling water flowing into the gradient coil 20 falls, according to the amount of change in the temperature detected by the temperature monitor 230.

Figure 6:
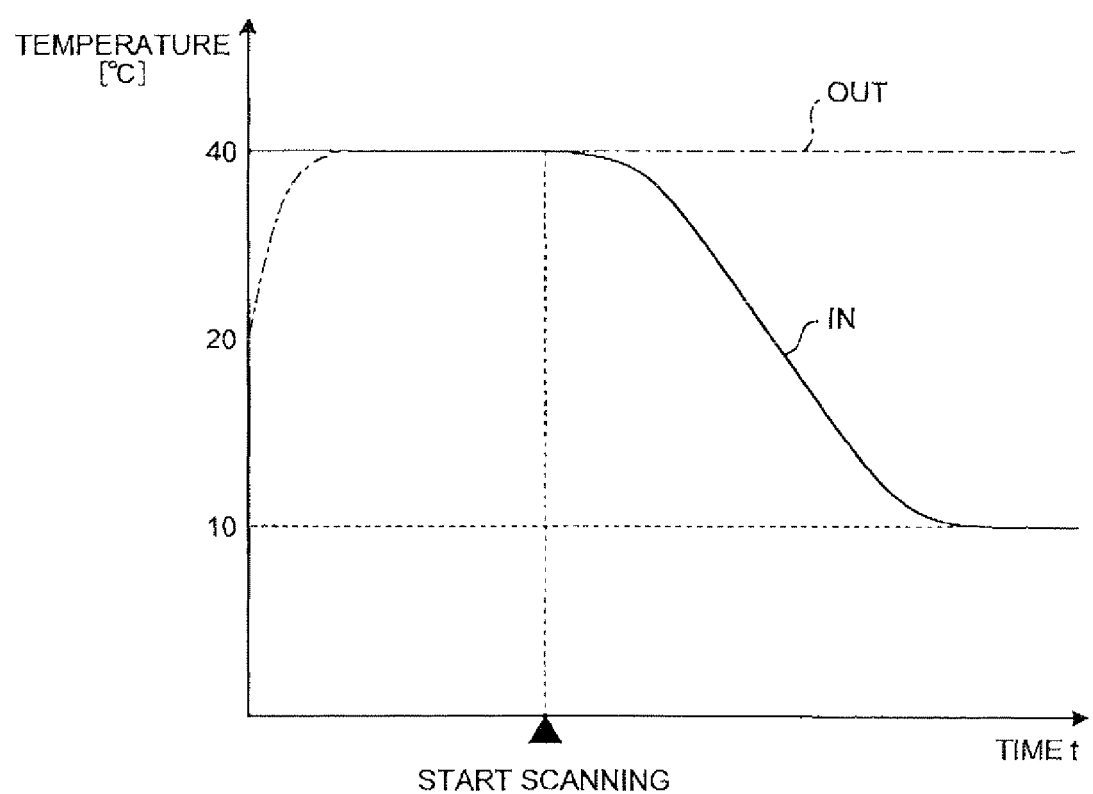
FIG. 6 is a chart for explaining an example of cooling water temperature control performed by a cooling control unit shown in FIG. 5.

FIG. 6 is a chart for explaining an example of cooling water temperature control performed by the cooling control unit 222 shown in FIG. 5. In FIG. 6, "IN" indicates the changes in the temperature of the cooling water flowing into the gradient coil 20, whereas "OUT" indicates the changes in the temperature of the cooling water flowing out of the gradient coil 20. In the present example, it is assumed that the normal temperature of the gradient coil 20 is 20° C., whereas the temperature of the cooling water supplied by the main cooling device 210 is 10° C., while the temperature of the gradient coil 20 that is set in the preheating process is 40° C.

In that situation, as shown in FIG. 6, before the scanning process is started, the cooling water that has been heated up to 40° C. by the gradient coil cooling device 220 flows into the gradient magnetic filed coil 20. Along with this, the temperature of the cooling water flowing out of the gradient coil 20 rises up to 40° C.

After the scanning process has been started, the blending ratio of the cooling water supplied from the main cooling device 210 and from the gradient coil cooling device 220 is adjusted, according to the amount of change in the temperature T detected by the temperature monitor 230. As a result, the temperature of the cooling water flowing into the gradient coil 20 gradually falls, and the temperature of the cooling water flowing out of the gradient coil 20 is kept at the substantially constant level near 40° C.

Figure 7:
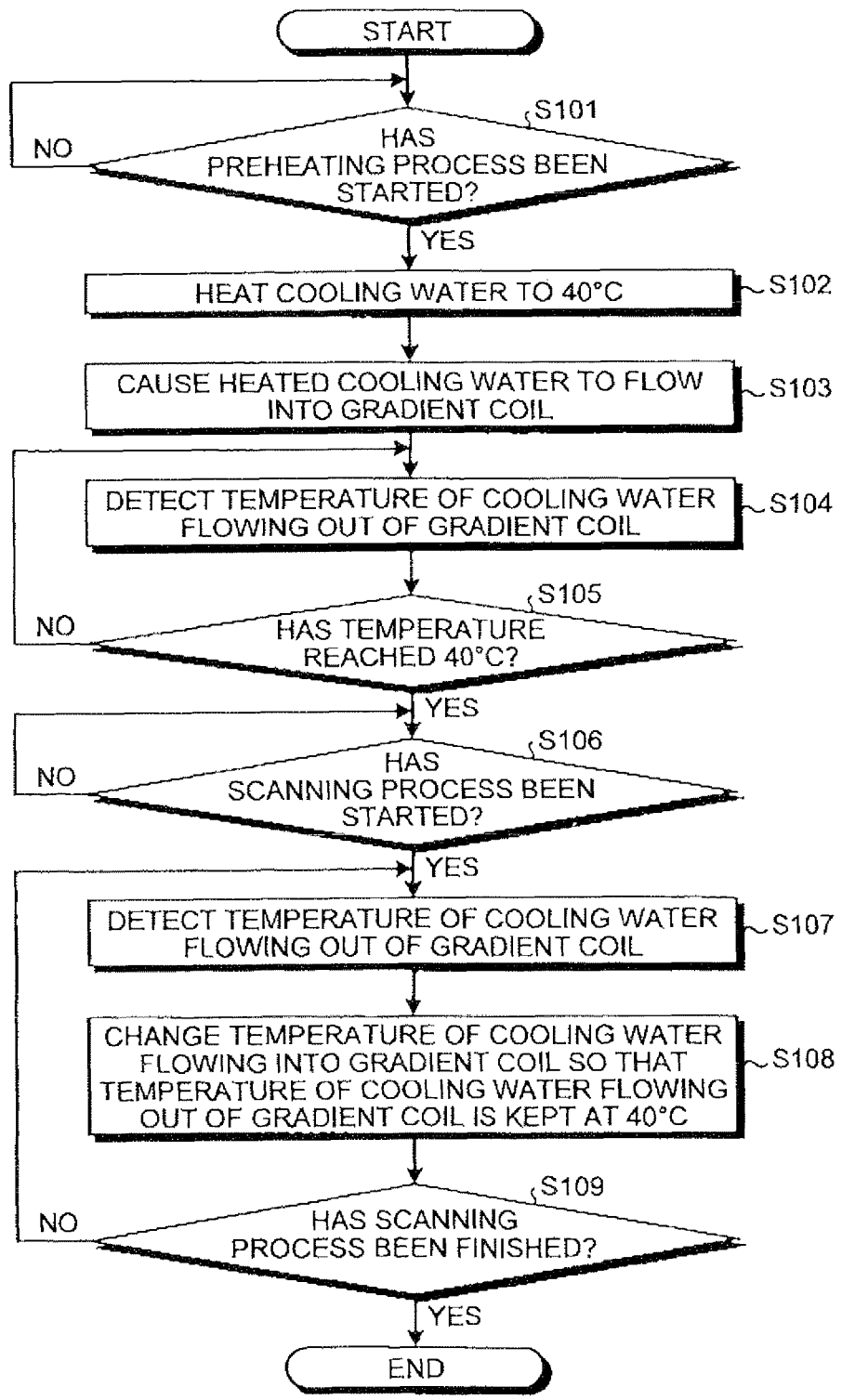
FIG. 7 is a flowchart for explaining a temperature control processing procedure performed by the gradient coil cooling device according to the first embodiment.

Next, a temperature control processing procedure performed by the gradient coil cooling device 220 according to the first embodiment will be explained. FIG. 7 is a flowchart for explaining the temperature control processing procedure performed by the gradient coil cooling device 220 according to the first embodiment. In the following sections, an example in which the temperature of the cooling water supplied by the main cooling device 210 is 10° C., whereas the temperature of the gradient coil 20 that is set in the preheating process is 40° C. will be explained.

As shown in FIG. 7, in the gradient coil cooling device 220, for example, when the cooling control unit 222 has received an instruction indicating that a preheating process should be started from the operator via the input unit (not shown) (step S101: Yes), the cooling control unit 222 heats the cooling water up to 40° C. by controlling the heater 221 (step S102).

Subsequently, the cooling control unit 222 causes the heated cooling water to flow into the gradient coil 20 by controlling the valves 240 and 250 (step S103). Also, the temperature monitor 230 detects the temperature of the cooling water flowing out of the gradient coil 20 (step S104).

After that, after the temperature of the gradient coil 20 has reached 40° C. (step S105: Yes), when the computer system 90 transmits a scanning start notification (step S106: Yes), the temperature monitor 230 detects the temperature of the cooling water flowing out of the gradient coil 20 (step S107).

Subsequently, the cooling control unit 222 changes the temperature of the cooling water flowing into the gradient coil 20 so that the temperature detected by the temperature monitor 230 is kept at the substantially constant level near 40° C. (step S108). After that, until the scanning process is finished, the processes at steps S107 and S108 will be repeatedly performed (step S109).

As described above, according to the first embodiment, the cooling control unit 222 included in the gradient coil cooling device 220 changes the temperature of the cooling water flowing into the gradient coil 20 so that the temperature detected by the temperature monitor 230 is kept at the substantially constant level, by controlling the condition of the cooling water circulating into the gradient coil 20 from the main cooling device 210. With this arrangement, it is possible to inhibit the changes in the temperature of the gradient coil 20 according to the magnitude of the heat generated during the scanning process.

Also, according to the first embodiment, the cooling control unit 222 raises the temperature of the cooling water flowing into the gradient coil 20, by causing the cooling water having the temperature higher than that of the cooling water circulating into the gradient coil 20 from the main cooling device 210 to circulate in the gradient coil 20. Thus, it is possible not only to cool the gradient coil 20 but also to raise the temperature of the gradient coil 20, as necessary.

Further, according to the first embodiment, the gradient coil cooling device 220 includes the heater 221 that heats the cooling water, so that the cooling control unit 222 raises the temperature of the cooling water circulated in the gradient coil 20 by controlling the heater 221. With this arrangement, it is possible to adjust the temperature of the cooling water at an arbitrary level and to more flexibly cool the gradient coil 20 according to the generated heat.

Furthermore, according to the first embodiment, before the scanning process is started, the cooling control unit 222 raises the temperature of the cooling water flowing into the gradient coil 20 up to the predetermined level. After the scanning process has been started, the cooling control unit 222 lowers the temperature of the cooling water flowing into the gradient coil 20 so that the temperature detected by the temperature monitor 230 is kept at the substantially constant level near the predetermined temperature. With this arrangement, it is possible to automatically exercise control so that the gradient coil 20 is at the temperature suitable for the scanning process at all times during the scanning process.

In the description of the first embodiment, the example has been explained in which the temperature of the cooling water is changed by using the heater; however, the present invention is not limited to this example. As another example, another arrangement is acceptable in which the temperature of the cooling water is changed by using a plurality of cooling medium storage tanks that store therein cooling water having mutually different temperatures.

In the following sections, as a second embodiment of the present invention, an example in which a gradient coil cooling device changes the temperature of the cooling water by using a plurality of cooling medium storage tanks will be explained. The configurations of the MRI apparatus and the cooling system according to the second embodiment are basically the same as those shown in FIGS. 1 to 4, and only the functions of the gradient coil cooling device are different. Thus, in the following sections, a configuration of the gradient coil cooling device according to the second embodiment will be explained.

Figure 8:
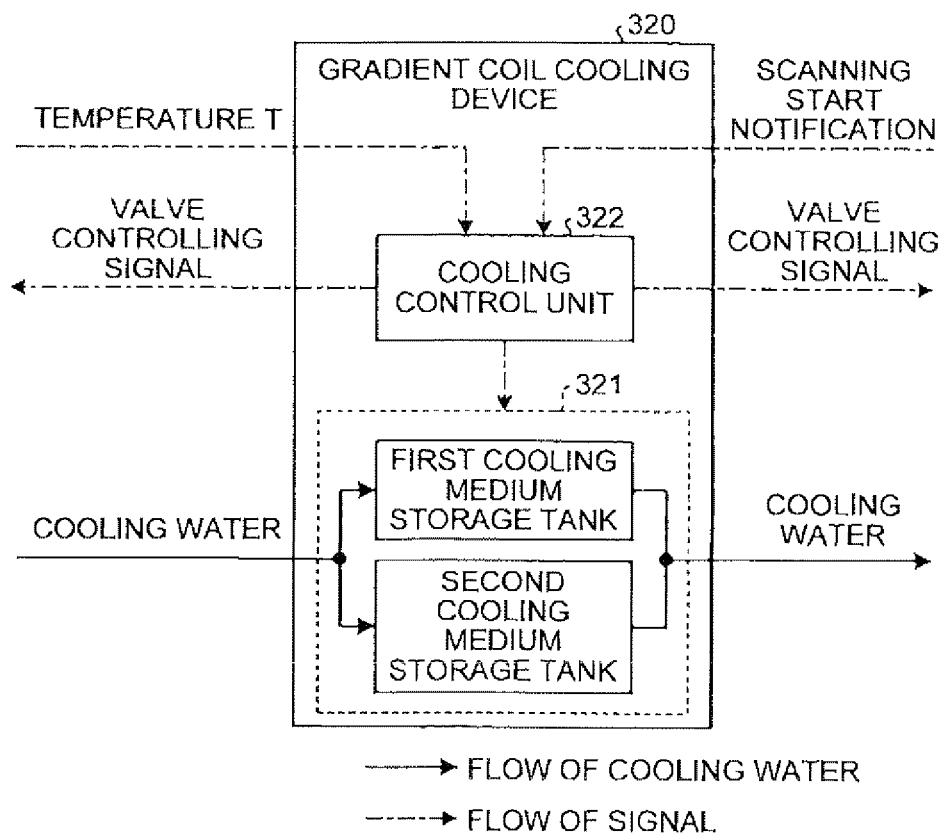
FIG. 8 is a block diagram of a gradient coil cooling device according to a second embodiment of the present invention.

FIG. 8 is a block diagram of a gradient coil cooling device 320 according to the second embodiment. As shown in FIG. 8, the gradient coil cooling device 320 includes a cooling medium storage unit 321 and a cooling control unit 322.

The cooling medium storage unit 321 includes a first cooling medium storage tank and a second cooling medium storage tank that store therein cooling water having mutually different temperatures. In the present example, it is assumed that the first cooling medium storage tank stores therein cooling water having a temperature higher than the temperature of the cooling water stored in the second cooling medium storage tank. It is also assumed that the cooling water stored in the first cooling medium storage tank and the cooling water stored in the second cooling medium storage tank each have a temperature higher than the temperature of the cooling water supplied by the main cooling device 220.

Like the cooling control unit 222 according to the first embodiment, the cooling control unit 322 changes the temperature of the cooling water flowing into the gradient coil 20 so that the temperature detected by the temperature monitor 230 is kept at the constant level, by controlling the condition of the cooling water circulating into the gradient coil 20 from the main cooling device 210. It should be noted that "the temperature kept at the constant level" may include an error within a predetermined tolerance range.

More specifically, to raise the temperature of the cooling water circulated in the gradient coil 20, the cooling control unit 322 supplies the cooling water stored in the first cooling medium storage tank to the circulation path extending from the main cooling device 210 to the gradient coil 20. In contrast, to lower the temperature of the cooling water circulated in the gradient coil 20, the cooling control unit 322 supplies the cooling water stored in the second cooling medium storage tank to the circulation path extending from the main cooling device 210 to the gradient coil 20.

As explained above, according to the second embodiment, the gradient coil cooling device 320 includes the first cooling medium storage tank and the second cooling medium storage tank that store therein the cooling water having the mutually different temperatures, so that the cooling control unit 322 changes the temperature of the cooling water circulated in the gradient coil 20 by using the cooling water stored in the cooling medium storage tanks. With this arrangement, according to the second embodiment, it is possible to change the temperature of the cooling water more promptly than in the example where the temperature of the cooling water is changed by using a heater or the like.

In the description of the second embodiment, the example has been explained in which the two cooling medium storage tanks are used; however, another arrangement is acceptable in which three or more cooling medium storage tanks are used. With this arrangement, it is possible to change the temperature of the cooling water in a more precise manner.

Also, in the description of the second embodiment, the example has been explained in which the gradient coil cooling device 320 includes the plurality of cooling medium storage tanks; however, the present invention is not limited to this example. For example, another arrangement is acceptable in which the main cooling device 210 includes a first cooling medium storage tank storing therein, at a predetermined temperature, the cooling water circulated in the gradient coil 20, whereas the gradient coil cooling device 320 includes a second cooling medium storage tank storing therein cooling water having a temperature that is higher than the temperature of the cooling water stored in the first cooling medium storage tank included in the main cooling device 210. In this situation, the cooling control unit 322 changes the temperature of the cooling water circulated in the gradient coil 20, by using the cooling water stored in the second cooling medium storage tank.

In the descriptions of the first and the second embodiments, the examples have been explained in which the gradient coil cooling device changes the temperature of the cooling water flowing into the gradient coil 20, for the purpose of keeping the temperature of the gradient coil 20 at the substantially constant level; however, the present invention is not limited to these examples. For example, another arrangement is acceptable in which, for the same purpose, a gradient coil cooling device changes the flow rate of the cooling water flowing into the gradient coil 20.

Thus, in the following sections, as a third embodiment of the present invention, an example in which a gradient coil cooling device changes the flow rate of the cooling water flowing into the gradient coil 20 will be explained. The configuration of the MRI apparatus according to the third embodiment is basically the same as those shown in FIGS. 1 to 3, and only the configuration of the cooling system and the functions of the gradient coil cooling device are different. Thus, in the following sections, a configuration of the cooling system and a configuration of the gradient coil cooling device according to the third embodiment will be explained.

Figure 9:
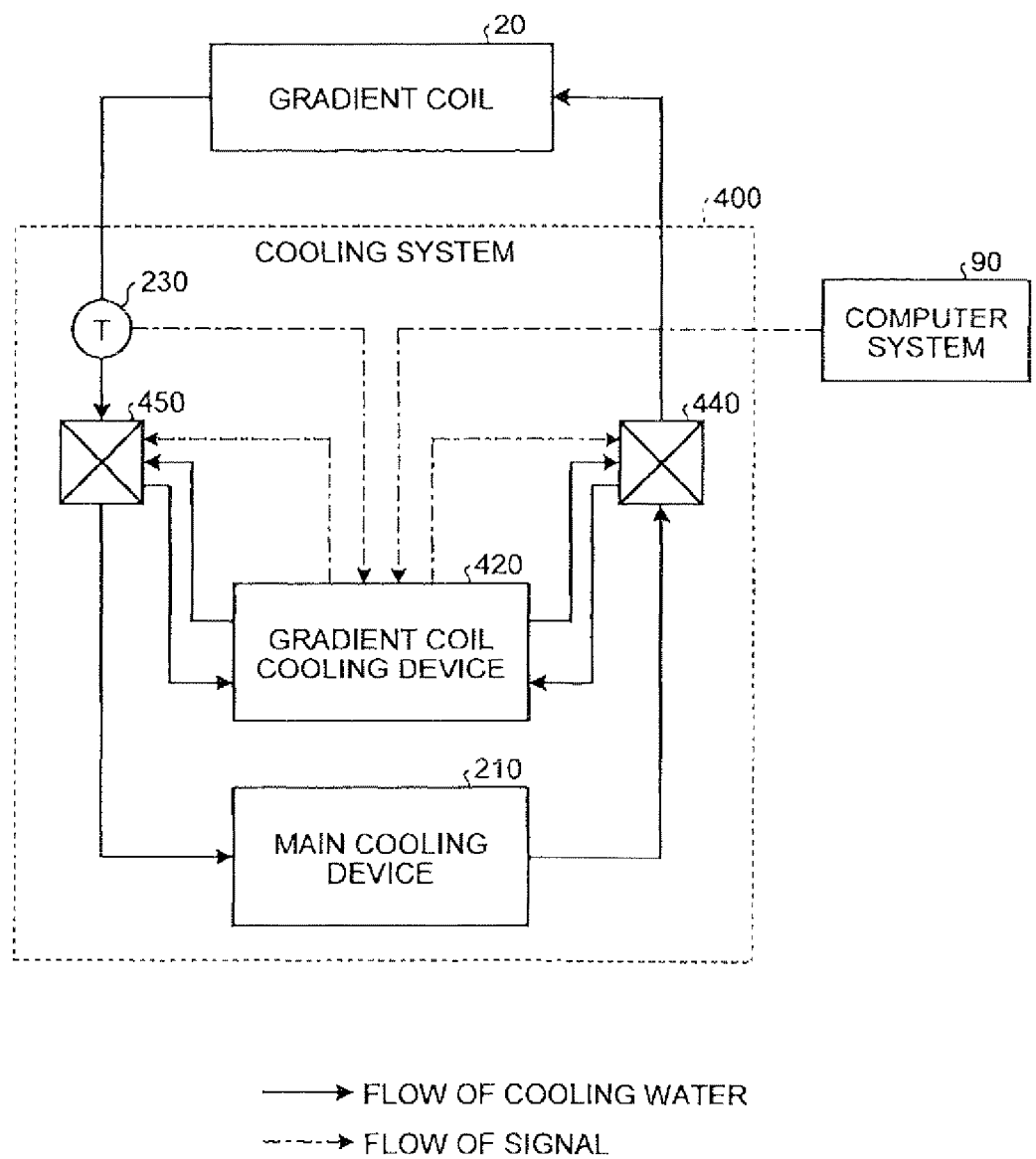
FIG. 9 is a block diagram of a cooling system according to a third embodiment of the present invention.

First, a configuration of the cooling system according to the third embodiment will be explained. FIG. 9 is a block diagram of a cooling system 400 according to the third embodiment. For the sake of convenience in explanation, some of the functional units that perform the same roles as those shown in FIG. 4 will be referred to by using the same reference characters, and detailed explanation thereof will be omitted.

As shown in FIG. 9, the cooling system 400 includes the main cooling device 210, a gradient coil cooling device 420, the temperature monitor 230, and valves 440 and 450.

Under the control of the gradient coil cooling device 420, the valves 440 and 450 control the flows of the cooling water supplied to the gradient coil 20 from the main cooling device 210 and the gradient coil cooling device 420.

The valves 440 and 450 are configured so as to be able to allow only one selected between (a) the cooling water supplied by the main cooling device 210 and (b) the cooling water supplied by the gradient coil cooling device 420 to circulate in the gradient coil 20. Further, the valves 440 and 450 are also configured so as to be able to blend the cooling water supplied from the main cooling device 210 with the cooling water supplied from the gradient coil cooling device 420 and to cause the blended cooling water to circulate in the gradient coil 20. Furthermore, the valves 440 and 450 are also configured so as to be able to adjust the blending ratio of the cooling water, as necessary. In addition, the valves 440 and 450 are also configured so as to be able to cause a part of the cooling water flowing out of the main cooling device 210 to flow into the gradient coil cooling device 420.

The gradient coil cooling device 420 causes the cooling water to circulate in the gradient coil 20 via the cooling water circulation path provided between the main cooling device 210 and the gradient coil 20. The gradient coil cooling device 420 is connected to the computer system 90, to the temperature monitor 230, and to each of the valves 440 and 450 in such a manner that communication therebetween is possible.

More specifically, via the valve 440, the gradient coil cooling device 420 supplies the cooling water to the circulation path extending from the main cooling device 210 to the gradient coil 20 and draws therein a part of the cooling water flowing out of the main cooling device 210. Also, via the valve 450, the gradient coil cooling device 420 draws therein a part of the cooling water flowing out of the gradient coil 20 and causes the cooling water that has been drawn therein via the valve 440 to flow out into the circulation path extending from the gradient coil 20 to the main cooling device 210.

In addition, according to the third embodiment, the gradient coil cooling device 420 is configured so as to change the flow rate of the cooling water flowing into the gradient coil 20 so that the temperature detected by the temperature monitor 230 is at a constant level, by controlling the condition of the cooling water circulating into the gradient coil 20 from the main cooling device 210. With this arrangement, according to the third embodiment, it is possible to inhibit the changes in the temperature of the gradient coil 20, according to the magnitude of the heat generated during the scanning process. In the following sections, the gradient coil cooling device 420 configured in this manner will be explained in detail.

Figure 10:
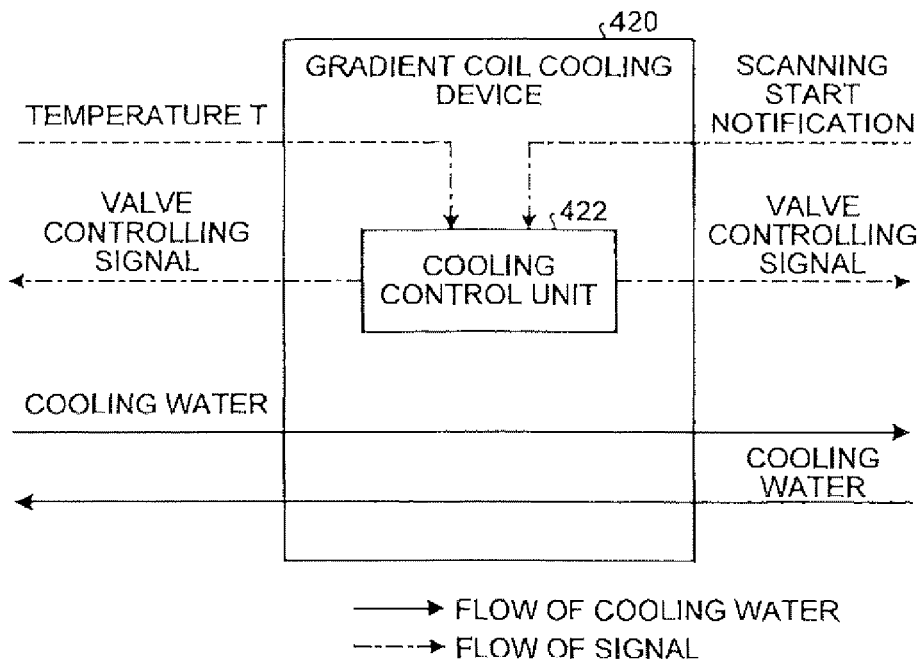
FIG. 10 is a block diagram of a gradient coil cooling device according to the third embodiment.

First, a configuration of the gradient coil cooling device 420 according to the third embodiment will be explained. FIG. 10 is a block diagram of the gradient coil cooling device 420 according to the third embodiment. As shown in FIG. 10, the gradient coil cooling device 420 includes a cooling control unit 422.

The cooling control unit 422 changes the flow rate of the cooling water flowing into the gradient coil 20 so that the temperature detected by the temperature monitor 230 is kept at the constant level, by controlling the condition of the cooling water circulating into the gradient coil 20 from the main cooling device 210. It should be noted that "the temperature kept at the constant level" may include an error within a predetermined tolerance range.

More specifically, in the case where the temperature detected by the temperature monitor 230 becomes lower than a predetermined temperature after the scanning process has been started, the cooling control unit 422 controls the valves 440 and 450 so that a part of the cooling water flowing out of the main cooling device 210 flows into the gradient coil cooling device 420, according to the amount of change. As a result, the flow rate of the cooling water flowing into the gradient coil 20 decreases, and the temperature of the gradient coil 20 rises.

In contrast, in the case where the temperature detected by the temperature monitor 230 becomes higher than the predetermined temperature after the scanning process has been started, the cooling control unit 422 controls the valves 440 and 450 so that the cooling water flowing out of the main cooling device 210 is combined with the cooling water flowing out of the gradient coil cooling device 420, according to the amount of change. As a result, the flow rate of the cooling water flowing into the gradient coil 20 increases, and the temperature of the gradient coil 20 falls.

Figure 11:
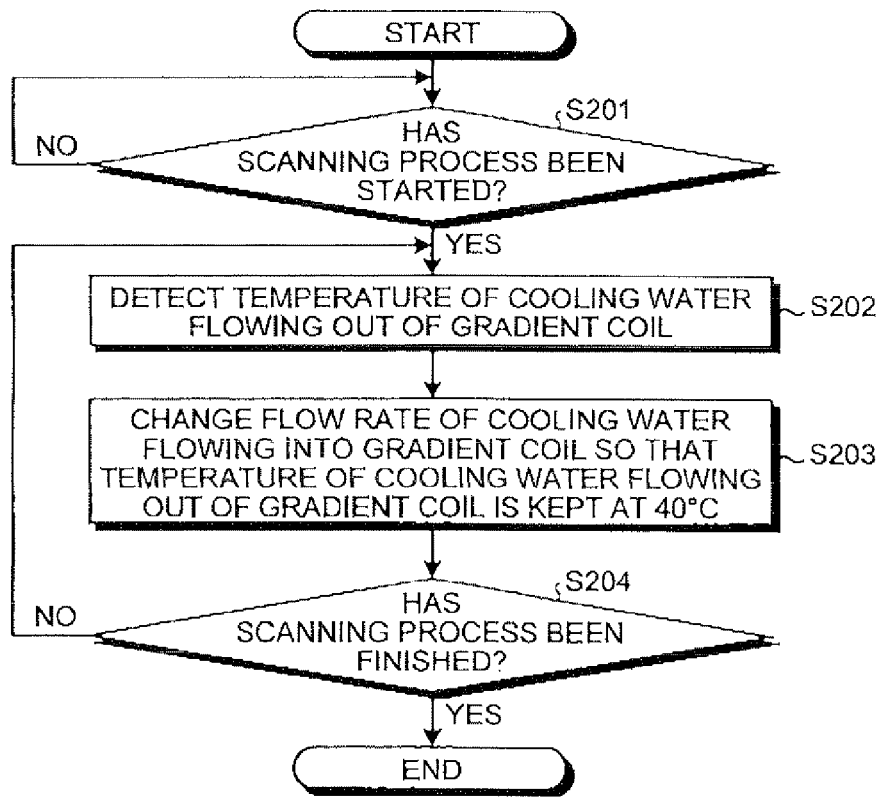
FIG. 11 is a flowchart for explaining a temperature control processing procedure performed by the gradient coil cooling device according to the third embodiment.

Next, a temperature control processing procedure performed by the gradient coil cooling device 420 according to the third embodiment will be explained. FIG. 11 is a flowchart for explaining the temperature control processing procedure performed by the gradient coil cooling device 420 according to the third embodiment.

As shown in FIG. 11, when a scanning start notification has been transmitted from the computer system 90 (step S201: Yes), the temperature monitor 230 detects the temperature of the cooling water flowing out of the gradient coil 20 (step S202).

Subsequently, the cooling control unit 422 changes the flow rate of the cooling water flowing into the gradient coil 20 so that the temperature detected by the temperature monitor 230 is kept at a substantially constant level (e.g., 40° C.) near a predetermined temperature (step S203). After that, until the scanning process is finished, the processes at steps S202 and S203 will be repeatedly performed (step S204).

As described above, according to the third embodiment, the cooling control unit 422 included in the gradient coil cooling device 420 changes the flow rate of the cooling water flowing into the gradient coil 20 so that the temperature detected by the temperature monitor 230 is kept at the substantially constant level, by controlling the condition of the cooling water circulating into the gradient coil 20 from the main cooling device 210. With this arrangement, it is possible to inhibit the changes in the temperature of the gradient coil 20 according to the magnitude of the heat generated during the scanning process.

In addition, according to the third embodiment, the cooling control unit 422 decreases the flow rate of the cooling water flowing into the gradient coil 20, by exercising control so that a part of the cooling water flowing out of the main cooling device 210 flows into the gradient coil cooling device 420. As a result, the temperature of the gradient coil 20 rises. Also, according to the third embodiment, the cooling control unit 422 increases the flow rate of the cooling water flowing into the gradient coil 20, by exercising control so that the cooling water flowing out of the main cooling device 210 is combined with the cooling water flowing out of the gradient coil cooling device 420. As a result, the temperature of the gradient coil 20 falls. According to the third embodiment, it is possible to adjust the temperature of the gradient coil 20 without having to use special equipment such as a heater or a cooling medium storage tank for changing the temperature of the cooling medium.

Further, in any of the exemplary embodiments described above, it is possible to obtain images having a stable image quality and fewer artifacts, because it is possible to inhibit the changes in the temperature of the gradient coil 20 according to the magnitude of the heat generated during the scanning process.

In the exemplary embodiments described above, the examples have been explained in which the temperature of the gradient coil 20 is raised up to the predetermined level (e.g., 40° C.) before the scanning process is started. In this situation, for example, in the case where cooling water at the normal temperature is caused to circulate in the gradient coil 20, the temperature rise of the gradient coil 20 stops at the point in time when, after the scanning process has been started, the heat absorption by the cooling water and the heat generation by the gradient coil 20 become balanced with each other. The temperature at the point in time when the heat absorption and the heat generation become balanced with each other in this manner will be referred to as a "saturation temperature". The saturation temperature is different for each of different locations within the gradient coil 20. In the following sections, examples in which each of the saturation temperatures is used as the predetermined temperature will be explained.

Figure 12:
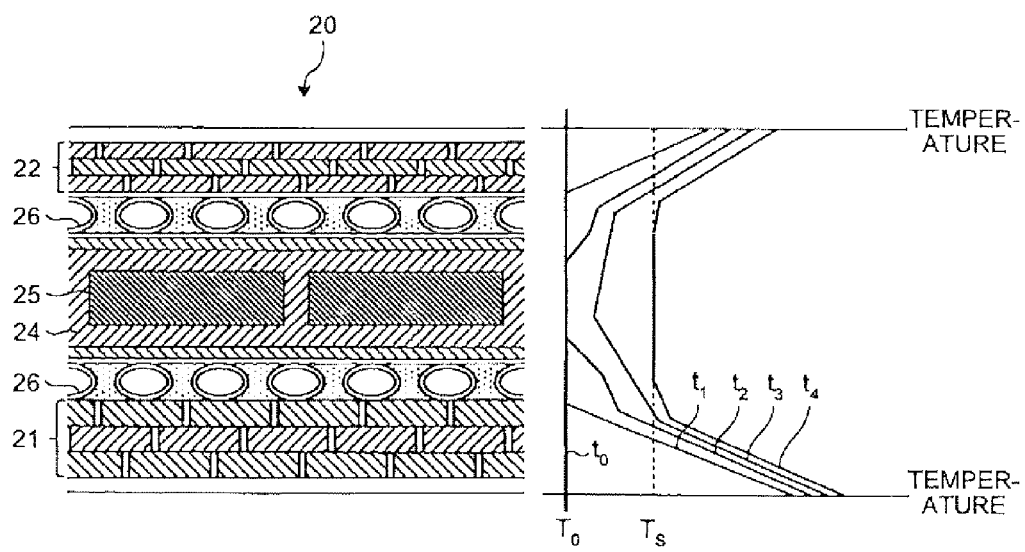
FIG. 12 is a drawing for explaining saturation temperatures within the gradient coil.

FIG. 12 is a drawing for explaining the saturation temperatures within the gradient coil 20. The left side portion of FIG. 12 is a cross-sectional view of a part of the gradient coil 20. The top of the cross-sectional view corresponds to the outer side of the circular cylindrical structure, whereas the bottom of the cross-sectional view corresponds to the inner side of the circular cylindrical structure. As shown in the cross-sectional view, within the gradient coil 20, the shim trays 24 storing therein the iron shims 25 are inserted between the main coil 21 and the shield coil 22. In addition, the cooling pipe 26 is embedded so as to be positioned between the main coil 21 and the shim trays 24 and between the shield coil 22 and the shim trays 24.

The right side portion of FIG. 12 indicates a temperature distribution in the up-and-down direction in the cross-sectional view shown on the left side. In this chart, $t_0$ indicates a temperature distribution within the gradient coil 20 at a time $t_0$ when the scanning process is started. Further, $t_1$ to $t_4$ indicate temperature distributions within the gradient coil 20 at times $t_1$ to $t_4$, respectively. In this situation, it is assumed that the relationship among the times can be expressed as $t_0 < t_1 < t_2 < t_3 < t_4$.

For example, let the temperature of the cooling water supplied to the gradient coil 20 be a normal temperature $T_0$. Further, as shown in FIG. 12, at the time $t_0$ when the scanning process is started, each of the temperatures at mutually different locations within the gradient coil 20 is also assumed to be $T_0$, being equal to the temperature of the cooling water. When the scanning process is started in this state, the temperatures at the mutually different locations within the gradient coil 20 gradually rise. After that, let us assume that, for example, at the time $t_4$, each of the temperatures at the mutually different locations within the gradient coil 20 reaches the saturation temperature. In this situation, let the temperature of the iron shims 25 at the time $t_4$ (i.e., the saturation temperature of the iron shims 25) be $T_s$. The saturation temperature $T_s$ of the iron shims 25 is kept lower than the temperatures of the other parts of the gradient coil 20 by the cooling water flowing through the cooling pipe 26.

However, as shown in FIG. 12, the temperature of the iron shims 25 changes from $T_0$ to $T_s$ during the scanning process, although the temperature is kept lower than the temperatures of the other parts by the cooling water. When the temperature of the iron shims 25 changes during the scanning process in this manner, the magnetic susceptibility of the iron shims 25 also changes along with the temperature. Further, along with the changes in the magnetic susceptibility of the iron shims 25, uniformity of the static magnetic field is lost, so that a center frequency $f_0$ fluctuates. The fluctuation of the center frequency can be a cause of hindrance for fat suppressions or a cause of artifacts in the images.

Figure 13:
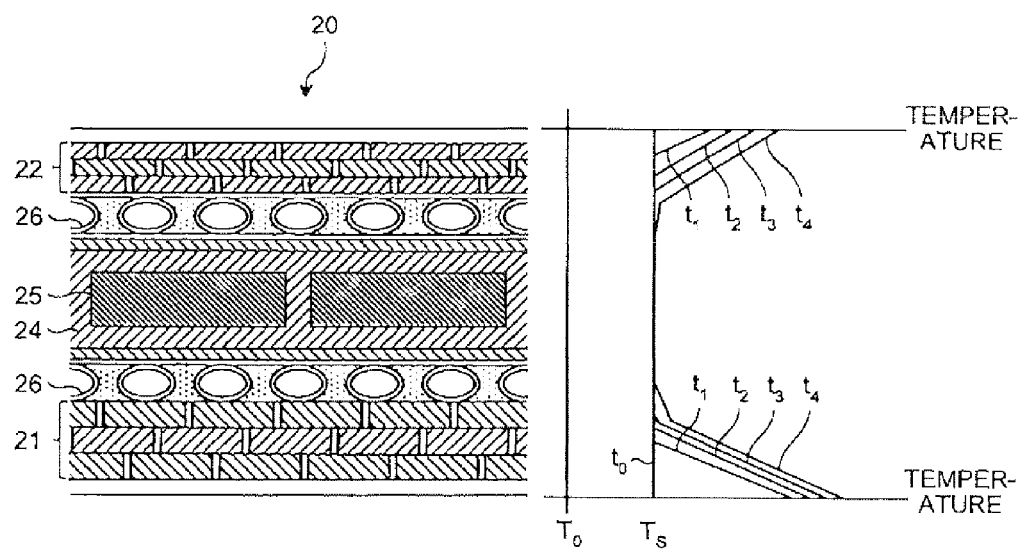
FIG. 13 is a drawing for explaining an example in which the temperature of iron shims is raised up to a saturation temperature before a scanning process is started.

To cope with this situation, for example, an arrangement is acceptable in which, before the scanning process is started, the cooling control unit raises the temperature of the iron shims 25 up to the saturation temperature in advance. FIG. 13 is a drawing for explaining an example in which the temperature of the iron shims 25 is raised up to the saturation temperature before the scanning process is started. In this situation, for example, before the scanning process is started, the cooling control unit raises the temperatures in the mutually different locations within the gradient coil 20 up to the temperature $T_s$ of the iron shims 25, by adjusting the temperature of the cooling water or the flow rate of the cooling water. As a result, as shown in FIG. 13, each of the temperatures in the mutually different locations within the gradient coil 20 at the time to is equal to $T_s$.

Subsequently, after the scanning process has been started, each of the temperatures in the mutually different locations within the gradient coil 20 gradually rises and reaches the saturation temperature at the time $t_4$. In this situation, because the temperature of the iron shims 25 has already reached the saturation temperature $T_s$ at the point in time when the scanning process is started, the temperature of the iron shims 25 does not change during the scanning process. Accordingly, it is possible to prevent the center frequency $f_0$ from fluctuating and to obtain an image in which fat is suppressed or an image having a high quality without artifacts.

MRI apparatuses perform scanning processes on a subject in units of imaging sequences. In this situation, the imaging sequences denote a series of processing procedures for implementing a predetermined image taking method. Examples of different types of imaging sequences include: a sequence for taking a T1 weighted image; a sequence for taking a T2 weighted image; a sequence for taking a Diffusion Weighted Image (DWI); a sequence for Fluid Attenuated Inversion Recovery (FLAIR); and a sequence for functional MRI (fMRI). Generally speaking, an imaging sequence is prepared for each of the sites of which images are taken, such as the head, the abdominal area, the heart, and the like.

Accordingly, before the execution of an imaging sequence is started, for example, the cooling control unit raises the temperature of the iron shims 25 up to a saturation temperature that is to be reached during the execution of the imaging sequence. More specifically, before the sequence controlling device 80 starts the execution of the imaging sequence, the cooling control unit raises the temperature of the iron shims 25 up to the saturation temperature by adjusting the temperature or the flow rate of the cooling water flowing into the cooling pipe 26. Further, during the execution of the imaging sequence, the cooling control unit adjusts the temperature or the flow rate of the cooling water flowing into the cooling pipe 26 so that the temperature detected by the temperature monitor 230 is kept equal to the temperature measured at the point in time when the execution of the imaging sequence is started.

In the description above, the example has been explained in which the cooling control unit raises the temperature of the iron shims 25 by adjusting the temperature or the flow rate of the cooling water flowing into the cooling pipe 26; however, the method for raising the temperature of the iron shims 25 is not limited to this example. As another example, another arrangement is acceptable in which the cooling control unit causes an electric current to flow in the gradient coil 20 and causes the gradient coil 20 to generate heat so that the cooling control unit raises the temperature of the iron shims 25 up to the saturation temperature by using the heat generated by the gradient coil 20. In this situation, the electric current supplied to the gradient coil 20 may be a direct current or an alternating current.

Yet another arrangement is acceptable in which the cooling control unit uses, in combination, the method by which the temperature or the flow rate of the cooling water is adjusted and the method by which an electric current is caused to flow in the gradient coil 20. With this arrangement, even in the case where, for example, the performance level of the cooling device that supplies the cooling water is low and it therefore takes time to adjust the temperature or the flow rate of the cooling water, it is possible to efficiently raise the temperature of the iron shims 25 in a short period of time with the heat generated by the gradient coil 20.

As for medical examinations using MRI apparatuses, in some situations, a plurality of types of images are taken during one examination. In those situations, the sequence controlling device 80 executes a plurality of imaging sequences for obtaining the images in a consecutive manner. Accordingly, for example, an arrangement is acceptable in which, before the execution of at least one of the plurality of imaging sequences is started, the cooling control unit raises the temperature of the iron shims 25 up to a saturation temperature that is to be reached during execution of said at least one of the imaging sequences.

Figure 14:
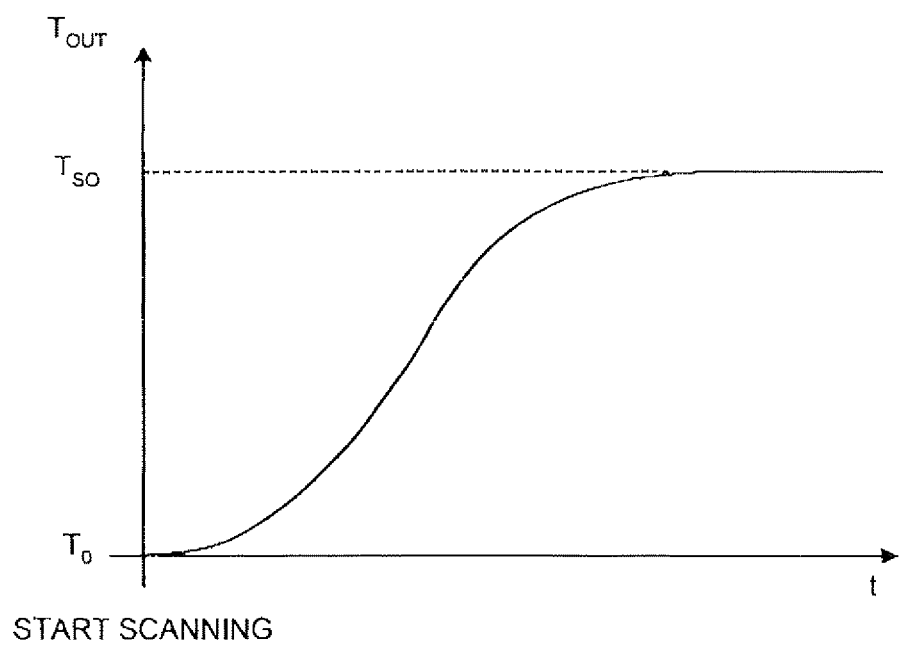
FIGS. 14 to 17 are charts for explaining temperature controlling processes for the gradient coil that are performed in examples in each of which a plurality of imaging sequences are executed.

FIG. 14 is a chart for explaining the changes in the temperature of the gradient coil 20 when an imaging sequence is executed. In FIG. 14, the horizontal axis expresses a time period "t" since the scanning process is started, whereas the vertical axis expresses a temperature $T_{out}$ of the cooling water flowing out of the gradient coil 20. For example, in the case where cooling water at the normal temperature is caused to circulate in the gradient coil 20, the temperature $T_{out}$ gradually rises, as shown in FIG. 14, along with the temperature rise within the gradient coil 20 after the scanning process is started. When a predetermined period of time has elapsed, the temperature $T_{out}$ reaches a saturation temperature $T_{s0}$. When the temperature $T_{out}$ of the cooling water flowing out of the gradient coil 20 has reached the saturation temperature $T_{s0}$ in this manner, it means that the temperature of the iron shims 25 provided in the gradient coil 20 has also reached the saturation temperature.

Figure 15:
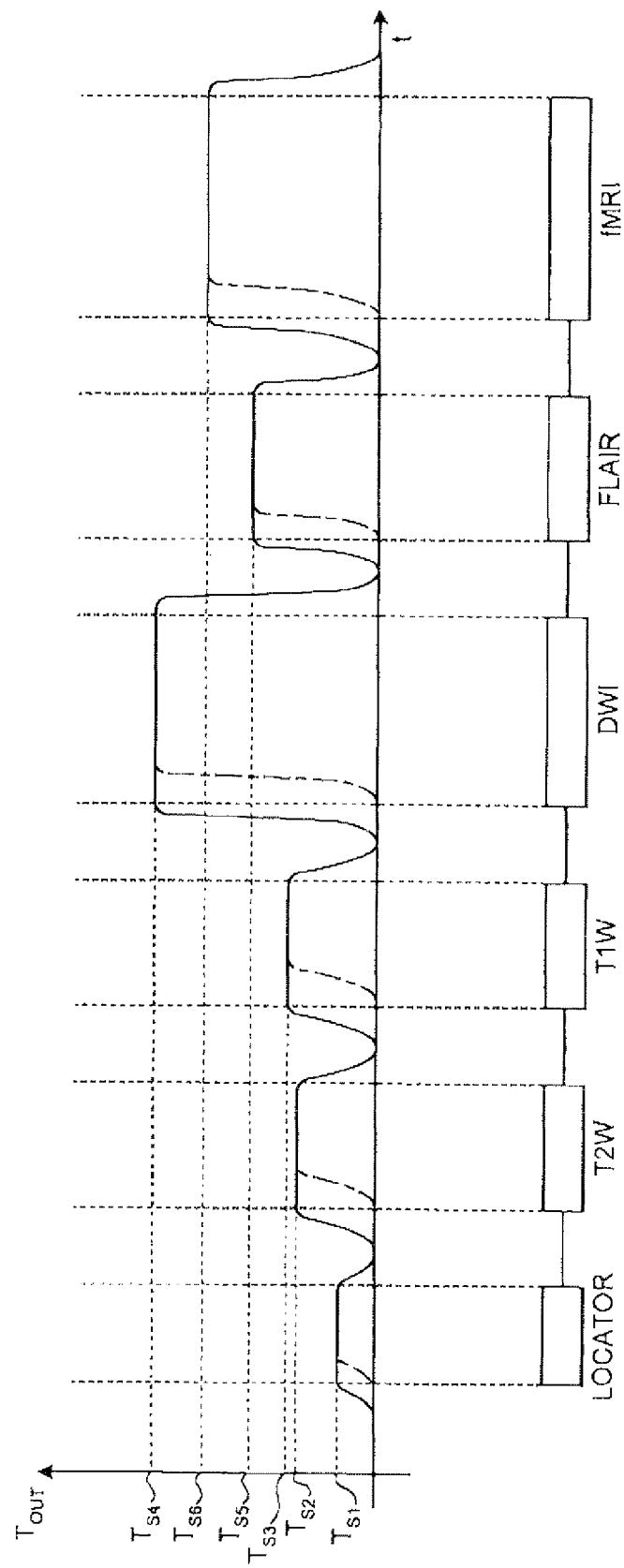
Figure 16:
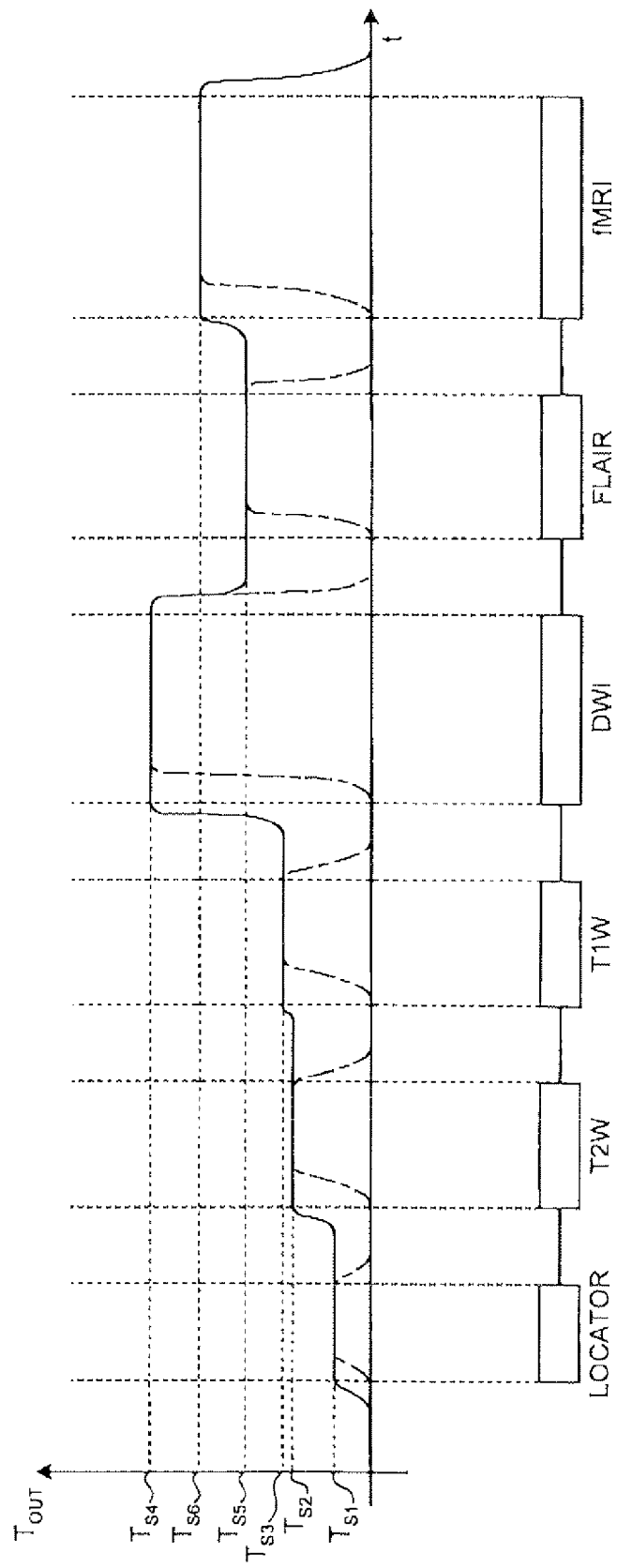
Figure 17:
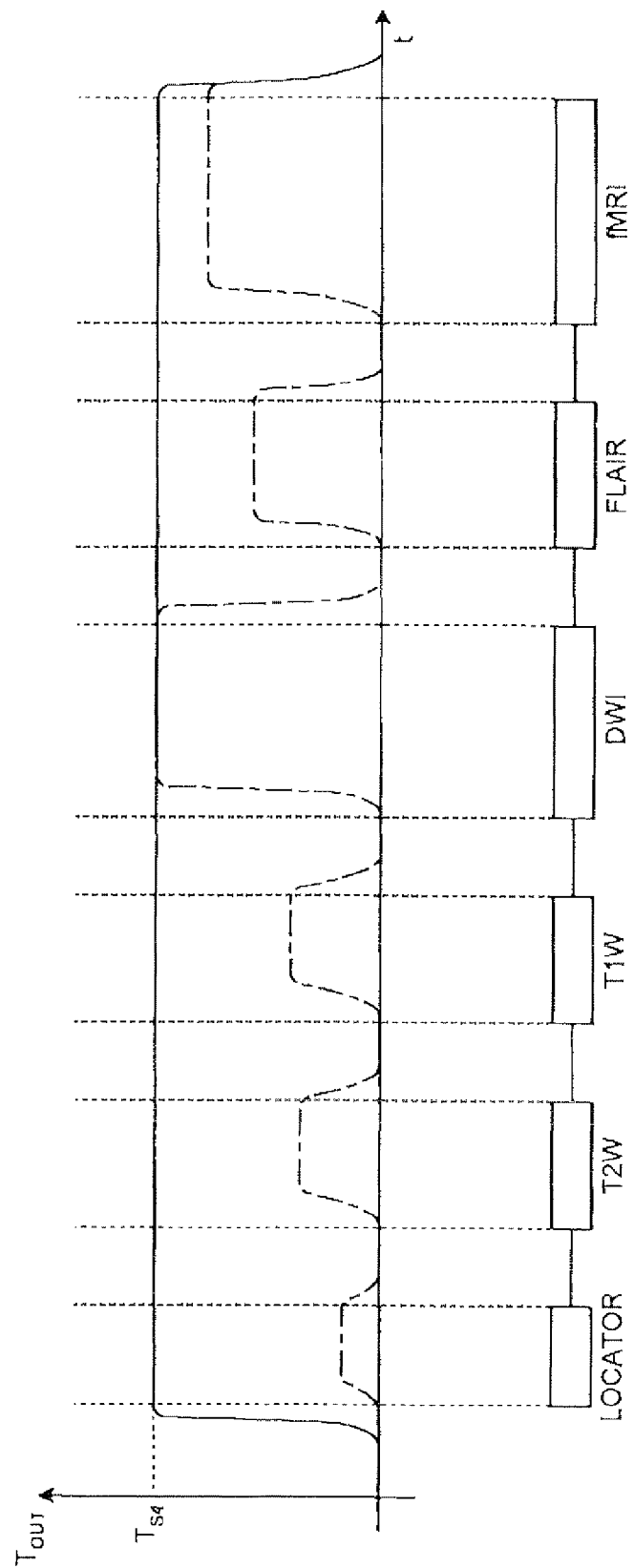

In this situation, generally speaking, the level of the electric current supplied to the gradient coil 20 is different for each of the imaging sequences. Accordingly, the saturation temperature for the temperature $T_{out}$ of the cooling water flowing out of the gradient coil 20 is also different for each of the imaging sequences. FIGS. 15 to 17 are charts for explaining temperature controlling processes for the gradient coil 20 that are performed in examples in each of which a plurality of imaging sequences are executed.

FIGS. 15 to 17 indicate examples in each of which the following sequences are executed in a consecutive manner: a sequence for taking an image for a position determining process (Locator); a sequence for taking a T2 weighted image (T2W); a sequence for taking a T1 weighted image (T1W); a sequence for taking a diffusion weighted image (DWI); a sequence for FLAIR; and a sequence for fMRI.

In FIGS. 15 to 17, the horizontal axis expresses an elapsed time period "t", whereas the vertical axis expresses the temperature $T_{out}$ of the cooling water flowing out of the gradient coil 20. Also, in FIGS. 15 to 17, each of the curves drawn with a dashed line indicates changes in the temperature $T_{out}$ in the example where cooling water at the normal temperature is caused to circulate in the gradient coil 20. In the case where the cooling water at the normal temperature is caused to circulate in the gradient coil 20, as shown in FIGS. 15 to 17, for each of the imaging sequences, the temperature $T_{out}$ gradually rises after the imaging sequence is started, reaches a saturation temperature, and gradually falls when the imaging sequence is finished.

In this situation, for example, let the saturation temperature when the Locator sequence is executed be $T_{s1}$, whereas let the saturation temperature when the T2W sequence is executed be $T_{s2}$. In addition, let the saturation temperature when the T1W sequence is executed be $T_{s3}$, whereas let the saturation temperature when the DWI sequence is executed be $T_{s4}$. Further, let the saturation temperature when the FLAIR sequence is executed be $T_{s5}$, whereas let the saturation temperature when the fMRI sequence is executed be $T_{s6}$. Also, it is assumed that the relationship among the saturation temperatures can be expressed as $T_{s1}<T_{s2}<T_{s3}<T_{s5}<T_{s6}<T_{s4}$.

In this situation, for example, a storage unit such as an internal memory stores therein, in advance and for each of the plurality of imaging sequences, the saturation temperature that corresponds to the situation in which the imaging sequence is executed. Further, for example, before the execution of each of the plurality of imaging sequences is started, the cooling control unit raises the temperature $T_{out}$ of the cooling water flowing out of the gradient coil 20 up to the saturation temperature corresponding to the imaging sequence, as indicated with the curve drawn with a solid line in FIG. 15. In this situation, it means that, before the execution of each of the imaging sequences is started, the temperature of the iron shims 25 also rises up to the saturation temperature that is to be reached during the execution of the imaging sequence.

For instance, in the example shown in FIG. 15, before the Locator sequence is executed, the cooling control unit raises the temperature $T_{out}$ up to $T_{s1}$. Also, before the T2W sequence is executed, the cooling control unit raises the temperature $T_{out}$ up to $T_{s2}$. In addition, before the T1W sequence is executed, the cooling control unit raises the temperature $T_{out}$ up to $T_{s3}$. Further, before the DWI sequence is executed, the cooling control unit raises the temperature $T_{out}$ up to $T_{s4}$.

Furthermore, before the FLAIR sequence is executed, the cooling control unit raises the temperature $T_{out}$ up to $T_{s5}$. Also, before the fMRI sequence is executed, the cooling control unit raises the temperature $T_{out}$ up to $T_{s6}$.

With these arrangements, in each of the imaging sequences, the temperature of the iron shims 25 is kept from changing during the execution of the imaging sequence. In the description above, the example in which the temperature of the cooling water is changed in each of ail the imaging sequences has been explained; however, for example, another arrangement is acceptable in which, with respect to only the imaging sequence having the highest saturation temperature among the plurality of imaging sequences, the temperature of the cooling water is raised before the imaging sequence is started.

As another example, another arrangement is acceptable in which, after the execution of each of the imaging sequences is finished, the cooling control unit raises or lowers the temperature $T_{out}$ of the cooling water flowing out of the gradient coil 20 up to (or down to) the saturation temperature corresponding to the immediately following imaging sequence, as indicated with the curve drawn with a solid line in FIG. 16. In this situation, it means that the temperature of the iron shims 25 also rises or falls along with the fluctuation of the temperature $T_{out}$.

For instance, in the example shown in FIG. 16, after the Locator sequence is executed, the cooling control unit raises the temperature $T_{out}$ from $T_{s1}$ to $T_{s2}$. Also, after the T2W sequence is executed, the cooling control unit raises the temperature $T_{out}$ from $T_{s2}$ to $T_{s3}$. In addition, after the T1W sequence is executed, the cooling control unit raises the temperature $T_{out}$ from $T_{s3}$ to $T_{s4}$. Further, after the DWI sequence is executed, the cooling control unit lowers the temperature $T_{out}$ from $T_{s4}$ to $T_{s5}$. Furthermore, after the FLAIR sequence is executed, the cooling control unit raises the temperature $T_{out}$ from $T_{s5}$ to $T_{s6}$. In this situation, because each of the differences representing the changes in the temperature of the cooling water between the imaging sequences is smaller than in the example shown in FIG. 15, it is possible to shorten the time period between the time when the execution of each of the imaging sequences is finished and the time when the immediately following imaging sequence is started.

As yet another example, yet another arrangement is acceptable in which, before the execution of the first imaging sequence is started, the cooling control unit raises the temperature $T_{out}$ of the cooling water flowing out of the gradient coil 20 up to the saturation temperature corresponding to the imaging sequence having the highest saturation temperature among the plurality of imaging sequences, as indicated with the curve drawn with a solid line in FIG. 17. In this situation, for example, after image taking conditions have been set by the operator, the cooling control unit calculates, for each of the plurality of imaging sequences included in the image taking conditions that have been set, a power duty cycle of the electric current to be supplied to the gradient coil 20. Subsequently, based on the calculated power duties, the cooling control unit determines the imaging sequence having the highest saturation temperature. In this situation, it means that, before the execution of the first one of the imaging sequences is started, the temperature of the iron shims 25 also rises up to the saturation temperature corresponding to the situation in which the imaging sequence having the highest iron-shim temperature among the imaging sequences is executed.

For instance, in the example shown in FIG. 17, before the Locator sequence is executed, the cooling control unit raises the temperature $T_{out}$ of the cooling water flowing out of the gradient coil 20 up to the saturation temperature $T_{s4}$ corresponding to the DWI sequence having the highest saturation temperature among the imaging sequences. In this situation, because there is no need to adjust the temperature of the cooling water between the imaging sequences, it is possible to control the temperature of the cooling water more easily.

In the description of the exemplary embodiments above, the examples have been explained in which the temperature or the flow rate of the cooling water caused to flow into the gradient magnetic field coil 20 is controlled during the preheating process of the gradient magnetic field coil 20 and after the scanning process is started, based on the temperature of the cooling water flowing out of the gradient magnetic field coil 20; however, another arrangement is acceptable in which, for example, a temperature monitor is provided on the iron shims 25 themselves or in the surrounding of the iron shims 25 so that the temperature or the flow rate of the cooling water caused to flow into the gradient magnetic field coil 20 is controlled during the preheating process of the gradient magnetic field coil 20 and after the scanning process is started, based on the temperature detected by the temperature monitor. Yet another arrangement is acceptable in which, for example, the temperature or the flow rate of the cooling water caused to flow into the gradient magnetic field coil 20 is changed according to changes in the center frequency $f_0$ in the magnetic fields within the image taking area.

As explained above, the magnetic resonance imaging apparatus according to an aspect of the present invention is useful in situations where the various types of units are cooled by using the cooling devices and is especially suitable for situations where it is required to keep the temperature of the gradient coil at a constant level during the scanning process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a gradient coil configured to apply a gradient magnetic field to a static magnetic field in which an examined subject is placed;
   a metal shim provided with the gradient coil and configured to correct spatial nonuniformity of the static magnetic field;
   an executing unit configured to execute an imaging sequence; and
   a temperature controlling unit configured to control a temperature of the metal shim during execution of the imaging sequence to be maintained approximately equal to the metal shim temperature at a point in time when execution of the imaging sequence is started.

2. The magnetic resonance imaging apparatus according to claim 1, wherein:
   the executing unit is configured to consecutively execute a plurality of imaging sequences, and
   the temperature controlling unit is configured to raise the temperature of the metal shim, before execution of at least one of the plurality of imaging sequences is started, up to a saturation temperature that is to be reached during execution of said at least one of the imaging sequences.

3. The magnetic resonance imaging apparatus according to claim 2, wherein:
   the temperature controlling unit is configured to raise the temperature of the metal shim, before execution of each of the plurality of imaging sequences is started, up to a saturation temperature that is to be reached during execution of the imaging sequence.

4. The magnetic resonance imaging apparatus according to claim 3, further comprising:
   a cooling pipe provided in a surrounding of the metal shim; and
   a cooling device configured to cause a cooling medium to circulate through the cooling pipe,
   wherein the controlling unit is configured to raise the temperature of the metal shim up to the saturation temperature by adjusting a temperature or a flow rate of the cooling medium flowing into the cooling pipe.

5. The magnetic resonance imaging apparatus according to claim 2, further comprising:
   a cooling pipe provided in a surrounding of the metal shim; and
   a cooling device configured to cause a cooling medium to circulate through the cooling pipe,
   wherein the controlling unit is configured to raise the temperature of the metal shim up to the saturation temperature by adjusting a temperature or a flow rate of the cooling medium flowing into the cooling pipe.

6. The magnetic resonance imaging apparatus according to claim 5, further comprising:
   a temperature detecting unit configured to detect a temperature of a cooling medium flowing out of the cooling pipe,
   wherein the controlling unit is configured to adjust a temperature or a flow rate of the cooling medium flowing into the cooling pipe during execution of the imaging sequence, to maintain the temperature detected by the temperature detecting unit substantially equal to a temperature that is measured at a point in time when execution of the imaging sequence is started.

7. The magnetic resonance imaging apparatus according to claim 5, wherein:
   the controlling unit is configured to raise the temperature of the metal shim up to the saturation temperature by causing an electric current to flow in the gradient coil.

8. The magnetic resonance imaging apparatus according to claim 5, wherein:
   the cooling device includes a heating unit configured to heat the cooling medium caused to circulate through the cooling pipe, and
   the controlling unit is configured to adjust the temperature of the cooling medium flowing into the cooling pipe, by controlling the heating unit.

9. The magnetic resonance imaging apparatus according to claim 2, wherein:
   the controlling unit is configured to raise the temperature of the metal shim up to the saturation temperature by causing an electric current to flow in the gradient coil.

10. The magnetic resonance imaging apparatus according to claim 9, further comprising:
    a cooling pipe provided in a surrounding of the metal shim;
    a cooling device configured to cause a cooling medium to circulate through the cooling pipe; and
    a temperature detecting unit is configured to detect a temperature of the cooling medium, flowing out of the cooling pipe,
    wherein the controlling unit adjusts a temperature or a flow rate of the cooling medium flowing into the cooling pipe during execution of the imaging sequence, to maintain the temperature detected by the temperature detecting unit substantially equal to a temperature that is measured at a point in time when execution of the imaging sequence is started.

11. The magnetic resonance imaging apparatus according to claim 10, wherein:
the cooling device includes a plurality of cooling medium storage tanks configured to store therein a cooling medium having mutually different temperatures, respectively, and
the controlling unit is configured to adjust the temperature of the cooling medium flowing into the cooling pipe, by using the cooling medium stored in the plurality of cooling medium storage tanks.

12. The magnetic resonance imaging apparatus according to claim 2, wherein:
the temperature controlling unit is configured to raise the temperature of the metal shim, before execution of an imaging sequence to be performed first among the plurality of imaging sequences is started, up to a saturation temperature corresponding to an imaging sequence having a highest metal-shim temperature among the plurality of imaging sequences to be executed.

13. The magnetic resonance imaging apparatus according to claim 1, further comprising:
a cooling pipe provided in a surrounding of the metal shim; and
a cooling device configured to cause a cooling medium to circulate through the cooling pipe,
wherein the controlling unit is configured to raise the temperature of the metal shim up to a predetermined temperature by adjusting a temperature or a flow rate of the cooling medium flowing into the cooling pipe.

14. The magnetic resonance imaging apparatus according to claim 13, further comprising:
a temperature detecting unit configured to detect a temperature of a cooling medium flowing out of the cooling pipe,
wherein the controlling unit is configured to adjust a temperature or a flow rate of the cooling medium flowing into the cooling pipe during execution of the imaging sequence, to maintain the temperature detected by the temperature detecting unit substantially equal to a temperature that is measured at a point in time when execution of the imaging sequence is started.

15. The magnetic resonance imaging apparatus according to claim 13, wherein:
the controlling unit is configured to raise the temperature of the metal shim up to the saturation temperature by causing an electric current to flow in the gradient coil.

16. The magnetic resonance imaging apparatus according to claim 13, wherein:
the cooling device includes a heating unit configured to heat the cooling medium caused to circulate through the cooling pipe, and
the controlling unit is configured to adjust the temperature of the cooling medium flowing into the cooling pipe, by controlling the heating unit.

17. The magnetic resonance imaging apparatus according to claim 1, wherein:
the controlling unit raises is configured to raise the temperature of the metal shim up to a predetermined temperature by causing an electric current to flow in the gradient coil.

18. The magnetic resonance imaging apparatus according to claim 17, further comprising:
a cooling pipe provided in a surrounding of the metal shim;
a cooling device configured to cause a cooling medium to circulate through the cooling pipe; and
a temperature detecting unit configured to detect a temperature of the cooling medium flowing out of the cooling pipe,
wherein the controlling unit is configured to adjust a temperature or a flow rate of the cooling medium flowing into the cooling pipe during execution of the imaging sequence, the temperature detected by the temperature detecting unit substantially equal to a temperature that is measured at a point in time when execution of the imaging sequence is started.

19. The magnetic resonance imaging apparatus according to claim 18, wherein:
the cooling device includes a plurality of cooling medium storage tanks configured to store therein a cooling medium having mutually different temperatures, respectively, and
the controlling unit is configured to adjust the temperature of the cooling medium flowing into the cooling pipe, by using the cooling medium stored in the plurality of cooling medium storage tanks.

20. A magnetic resonance imaging apparatus comprising:
a gradient coil configured to apply a gradient magnetic field to a static magnetic field in which an examined subject is placed;
a metal shim provided with the gradient coil and configured to correct spatial nonuniformity of the static magnetic field;
an executing unit configured to execute an imaging sequence;
a cooling pipe configured to cool the gradient coil; and
a controlling unit configured to control a temperature or a flow rate of the cooling medium flowing into the cooling pipe to maintain temperature of the cooling medium flowing out of the cooling pipe during execution of the imaging sequence approximately equal to a temperature of the cooling medium measured at a point in time when execution of the imaging sequence is started.

* * * * *